US012460863B2

(12) United States Patent
Kang et al.

(10) Patent No.: US 12,460,863 B2
(45) Date of Patent: Nov. 4, 2025

(54) APPARATUS FOR TREATING A SUBSTRATE

(71) Applicant: SEMES CO., LTD., Chungcheongnam-do (KR)

(72) Inventors: Ki-Moon Kang, Gyeonggi-do (KR); Hyun Goo Park, Gyeonggi-do (KR); Hyo Won Yang, Seoul (KR)

(73) Assignee: SEMES CO., LTD., Chungcheongnam-Do (KR)

( * ) Notice: Subject to any disclaimer, the term of this patent is extended or adjusted under 35 U.S.C. 154(b) by 784 days.

(21) Appl. No.: 17/825,420

(22) Filed: May 26, 2022

(65) Prior Publication Data

US 2023/0384029 A1 Nov. 30, 2023

(51) Int. Cl.
*F26B 5/00* (2006.01)
(52) U.S. Cl.
CPC .................... *F26B 5/005* (2013.01)
(58) Field of Classification Search
CPC ........................................ F26B 5/005
USPC ............................................ 34/68
See application file for complete search history.

(56) References Cited

U.S. PATENT DOCUMENTS

| | | | | |
|---|---|---|---|---|
| 6,067,728 A * | 5/2000 | Farmer | ............... | H01L 21/6719 34/470 |
| 6,161,311 A * | 12/2000 | Doley | ................. | C23C 16/4408 34/570 |
| 6,398,875 B1 * | 6/2002 | Cotte | ................ | H01L 21/67034 34/448 |
| 6,928,746 B2 * | 8/2005 | Arena-Foster | ............ | B81C 1/00 430/311 |
| 7,503,334 B1 * | 3/2009 | Shrinivasan | .......... | B08B 7/0021 134/109 |
| 7,980,003 B2 * | 7/2011 | Aoki | ................. | H01L 21/67748 438/584 |

(Continued)

FOREIGN PATENT DOCUMENTS

| CN | 118116829 A | * 5/2024 | ............. B08B 3/022 |
|---|---|---|---|
| JP | 2001-324263 A | 11/2001 | |

(Continued)

OTHER PUBLICATIONS

Office Action dated Oct. 31, 2022 issued by the Korean Patent Office in corresponding Korean Patent Application No. 10-2020-0180316, with English translation.

(Continued)

*Primary Examiner* — Stephen M Gravini
(74) *Attorney, Agent, or Firm* — Carter, DeLuca & Farrell LLP

(57) ABSTRACT

The inventive concept provides a substrate treating apparatus. The substrate treating apparatus includes a chamber having a treating space therein; a substrate support unit configured to support a substrate in the treating space; and a fluid supply unit configured to supply a fluid in a supercritical state to the treating space, wherein the fluid supply unit comprises: a supply line provided at a top wall of the chamber; and a discharge unit installed at the top wall of the chamber and configured to discharge a fluid to a substrate, and wherein the discharge unit comprises: a body having a discharge fluid channel for the fluid; a nozzle plate provided at a discharge end of the body; and a blocking plate within the discharge fluid channel and spaced apart from the nozzle plate.

20 Claims, 11 Drawing Sheets

(56) References Cited

U.S. PATENT DOCUMENTS

| | | | | |
|---|---|---|---|---|
| 8,020,315 B2* | 9/2011 | Nishimura | ........ | H01L 21/67248 34/80 |
| 10,395,950 B2* | 8/2019 | Goshi | ............... | H01L 21/67034 |
| 10,529,594 B2* | 1/2020 | Lim | .................... | H01L 21/6708 |
| 10,576,493 B2* | 3/2020 | Egashira | ............... | B05C 5/0225 |
| 12,222,159 B2* | 2/2025 | Yoon | ....................... | F26B 21/14 |
| 2019/0333759 A1 | 10/2019 | Lee et al. | | |
| 2023/0384029 A1* | 11/2023 | Kang | ............... | H01L 21/68721 |
| 2024/0173751 A1* | 5/2024 | Park | .......................... | G03F 7/38 |

FOREIGN PATENT DOCUMENTS

| | | | | |
|---|---|---|---|---|
| JP | 2008-159728 A | | 7/2008 | |
| JP | 2013-80908 A | | 5/2013 | |
| JP | 2019-33246 A | | 2/2019 | |
| JP | 7318066 B1 | * | 7/2023 | |
| KR | 10-2007-0099853 A | | 10/2007 | |
| KR | 10-2014-0132601 A | | 11/2014 | |
| KR | 10-2017-0136775 A | | 12/2017 | |
| KR | 10-2018-0086165 A | | 7/2018 | |
| KR | 10-2019-0092899 A | | 8/2019 | |
| KR | 10-2020-0077282 A | | 6/2020 | |
| KR | 2022089821 A | * | 6/2022 | ............. B05C 11/10 |
| KR | 20240081685 A | * | 6/2024 | |

OTHER PUBLICATIONS

Office Action dated Mar. 28, 2023 issued by the Japanese Patent Office in corresponding JP Patent Application No. 2022-085917, with English translation.

* cited by examiner

APPARATUS FOR TREATING A SUBSTRATE

TECHNICAL FIELD

Embodiments of the inventive concept described herein relate to a substrate treating apparatus, more specifically, an apparatus for treating a substrate by supplying a supercritical fluid to the substrate.

BACKGROUND

In order to manufacture a semiconductor device, a desired pattern is formed on a substrate through various processes such as a photolithography process, an etching process, an ashing process, an ion implantation process, and a thin film deposition process. In each process, various treating liquids are used and contaminants and particles are generated during the process. To solve this problem, a cleaning process for cleaning the contaminants and the particles is essentially performed before and after each process.

Generally, in the cleaning process, the substrate is treated with a chemical and a rinsing liquid and then dry treated. In the dry treating step, the substrate is dry treated with an organic solvent such as an isopropyl alcohol IPA as a process for drying a rinsing liquid remaining on the substrate. However, as a distance (CD, Critical Dimension) between patterns formed on the substrate becomes finer, the organic solvent remains in a space between the patterns.

In order to remove a residual organic solvent, a supercritical treating process is performed. In the supercritical treating process, a supercritical fluid is supplied to a substrate located in a chamber to treat the substrate. The supercritical treating process proceeds at a critical pressure and atmosphere at a critical temperature or above. FIG. 1 is a cross-sectional view illustrating a conventional supercritical treating apparatus. Referring to FIG. 1, a fluid is supplied to a center of the substrate W through a bottom fluid channel 3 formed on a bottom wall of the chamber 2 and a top fluid channel 4 formed on the top wall of the chamber 2, and then dispersed to an edge region of the substrate W.

In the apparatus of FIG. 1, the top fluid channel 4 is formed in a cylindrically shaped line and is supplied to the center of the substrate W. In this case, there is a problem in that the substrate W may be damaged when a supplied fluid is directly injected to the substrate W at a high speed.

SUMMARY

Embodiments of the inventive concept provide a substrate treating apparatus for improving a substrate treating efficiency.

Embodiments of the inventive concept provide a substrate treating apparatus for minimizing a phenomenon in which a substrate is damaged due to a speed of a fluid being supplied, when the fluid is supplied through a top fluid channel of the chamber.

Embodiments of the inventive concept provide a substrate treating apparatus for supplying a fluid through a top fluid channel even when a pressure is low within a chamber when dry treating a substrate by supplying a supercritical fluid.

The technical objectives of the inventive concept are not limited to the above-mentioned ones, and the other unmentioned technical objects will become apparent to those skilled in the art from the following description.

The inventive concept provides a substrate treating apparatus. The substrate treating apparatus includes a chamber having a treating space therein; a substrate support unit configured to support a substrate in the treating space; and a fluid supply unit configured to supply a fluid in a supercritical state to the treating space, wherein the fluid supply unit comprises: a supply line provided at a top wall of the chamber; and a discharge unit installed at the top wall of the chamber and configured to discharge a fluid to a substrate, and wherein the discharge unit comprises: a body having a discharge fluid channel for the fluid; a nozzle plate provided at a discharge end of the body; and a blocking plate within the discharge fluid channel and spaced apart from the nozzle plate.

In an embodiment, the nozzle plate has a plurality of first holes in a first region thereof, and a plurality of second holes in a second region thereof, the first region including peripheral region of the nozzle plate and the second region including a central region of the nozzle plate, wherein a cross-section area of the first hole is larger than a cross-sectional area of the second hole.

In an embodiment, the blocking plate is disposed such that the plurality of the second holes are located under the blocking plate.

In an embodiment, a diameter of the blocking plate is substantially equal to a diameter of the second region of the nozzle plate.

In an embodiment, the blocking plate is substantially aligned with the second region of the nozzle plate.

In an embodiment, the number of the plurality of the first holes is smaller than the number of the plurality of the second holes.

In an embodiment, the discharge fluid channel is formed through the body from a top surface to a bottom surface thereof, and a diameter of the discharge fluid channel is constant.

In an embodiment, the discharge fluid channel is formed through the body from a top surface to a bottom surface thereof, and a diameter of the discharge fluid channel gradually increases from the top surface of the body to the bottom surface of the body.

In an embodiment, the fluid includes a supercritical fluid.

The inventive concept provides a substrate treating apparatus. The substrate treating apparatus includes a chamber having a treating space therein; a substrate support unit configured to support a substrate in the treating space; and a fluid supply unit configured to supply a fluid in a supercritical state to the treating space, wherein the fluid supply unit comprises: a supply line provided at a top wall of the chamber; and a discharge unit installed at the top wall of the chamber and configured to discharge a fluid to a substrate, and wherein the discharge unit comprises: a body having a discharge fluid channel for the fluid; and a nozzle plate provided at a discharge end of the body; and wherein the nozzle plate comprises: a first region having a plurality of first holes, the first region including a peripheral region of the nozzle plate; and a second region having a plurality of second holes, the second region including a central region of the nozzle plate, and wherein a diameter of the first hole is larger than a diameter of the second hole.

In an embodiment, the discharge unit comprises a blocking plate within the discharge fluid channel and spaced apart from the nozzle plate.

In an embodiment, the blocking plate has a size substantially corresponding to a size of the second region of the nozzle plate.

In an embodiment, the blocking plate is substantially aligned with the second region of the nozzle plate.

In an embodiment, the number of the plurality of first holes is smaller than the number of the plurality of second holes.

In an embodiment, the plurality of first holes are spaced apart from each other along a circumferential direction of the nozzle plate such that the plurality of first holes surround the plurality of second holes.

In an embodiment, the plurality of first holes are spaced apart from each other along a circumferential direction of the nozzle plate such that the plurality of first holes surround the plurality of second holes.

In an embodiment, the discharge fluid channel is formed through the body from a top and surface to a bottom surface, and a diameter of the discharge fluid channel is constant from the top surface to the bottom surface.

In an embodiment, the discharge fluid channel is formed through the body from a top surface to a bottom surface, and a inner diameter of the discharge fluid channel gradually increases from the top surface to the bottom surface.

In an embodiment, the nozzle plate has a size corresponding to a size of a discharge port of the discharge fluid channel formed at the bottom surface of the body.

In an embodiment, the fluid includes a supercritical fluid.

The inventive concept provides a substrate treating apparatus. The substrate treating apparatus includes a chamber having a treating space therein; a substrate support unit configured to support a substrate in the treating space; and a fluid supply unit configured to supply a fluid in a supercritical state to the treating space, wherein the fluid supply unit comprises: a supply line provided at a top wall of the chamber; and a discharge unit installed at the top wall of the chamber and configured to discharge a fluid to the substrate, and wherein the discharge unit comprises: a discharge fluid channel for the fluid; a nozzle plate provided at an end of the discharge fluid channel; and a blocking plate within the discharge fluid channel and spaced apart from the nozzle plate, and wherein the nozzle plate comprises: a first region having a plurality of first holes with a first diameter formed therein, the first region including a peripheral region of the nozzle plate; and a second region having a plurality of second holes with a second diameter smaller than the first diameter, the second region including a central region of the nozzle plate, and wherein the blocking plate has a size corresponding to a size of the second region of the nozzle plate, and the blocking plate is substantially aligned with the second region of the nozzle plate.

According to an embodiment of the inventive concept, a substrate treating apparatus for improving a substrate treating efficiency may be provided.

According to an embodiment of the inventive concept, a phenomenon in which a substrate is damaged due to a speed of a fluid being supplied when the fluid is supplied through a top fluid channel of a chamber may be minimized.

According to an embodiment of the inventive concept, a fluid may be supplied through a top fluid channel even when a pressure within a chamber is low when dry treating a substrate by supplying a supercritical fluid.

The effects of the inventive concept are not limited to the above-mentioned ones, and the other unmentioned effects will become apparent to those skilled in the art from the following description.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
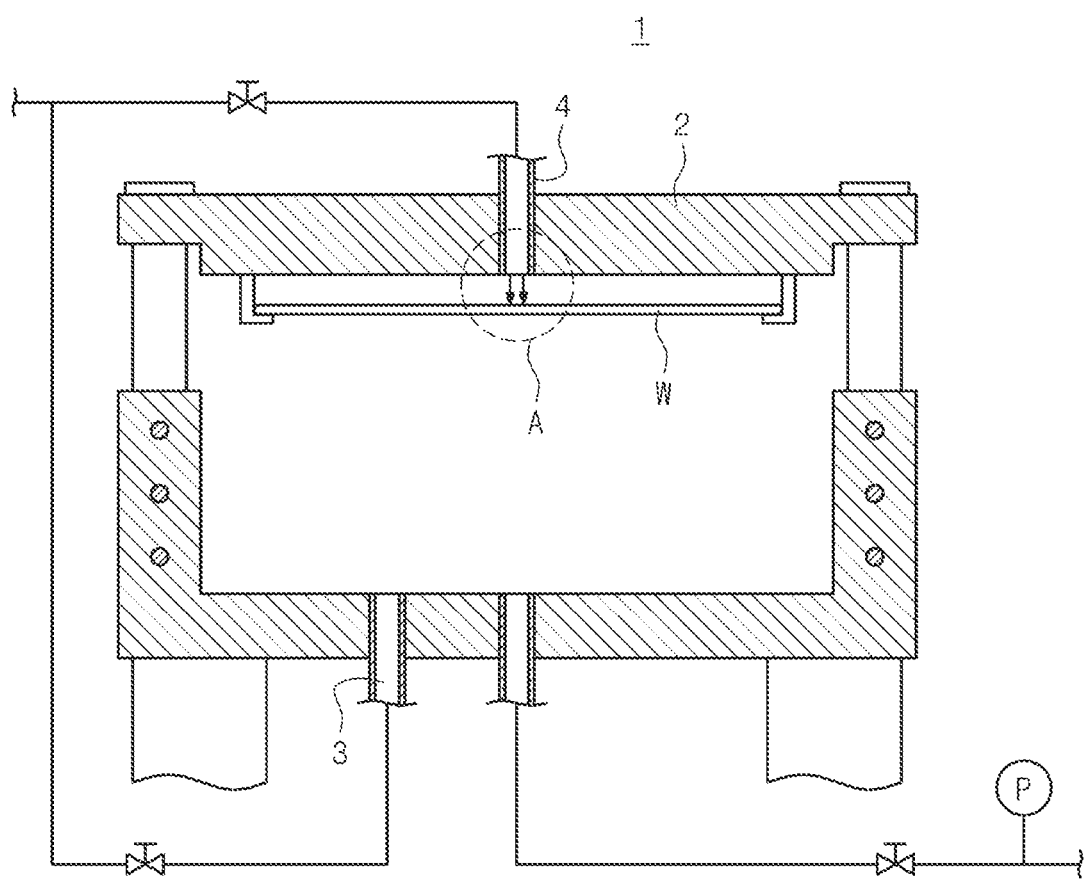
FIG. 1 is a cross-sectional view illustrating a conventional supercritical treating apparatus.

Hereinafter, embodiments of this invention will be described in detail with reference to the accompanying drawings so that those of ordinary skill in the technical field to which this invention belongs can easily implement this invention. However, the inventive concept may be implemented in various different forms and is not limited to the embodiments described herein. In addition, in describing a correct embodiment of the inventive concept in detail, when it is determined that a detailed description of related known functions or configurations may unnecessarily obscure the gist of the inventive concept, the detailed description thereof will be omitted. In addition, a same sign is used throughout the drawing for parts with similar functions and actions.

To "include" a component means that it may include more other components, not excluding other components unless otherwise stated. Specifically, the term "include" or "have" should be understood to designate that there are features, numbers, steps, operations, components, or a combination thereof described in the specification, and do not preclude the presence or addition of one or more other features or numbers, steps, operations, components, or combinations thereof.

The singular expression includes plural expressions unless the context clearly implies otherwise. In addition, shapes and sizes of elements in the drawings may be exaggerated for clearer explanation.

The term "and/or" includes any one of the listed items and all combinations of one or more. In addition, in the present specification, the term "connected" means not only a case where member A and member B are directly connected, but also a case where member C is interposed between member A and member B to indirectly connect member A and member B.

Embodiments of the inventive concept may be modified in various forms, and the scope of the inventive concept should not be construed as being limited to the following embodiments. The embodiment of the inventive concept is provided to more fully explain the inventive concept on to those with average knowledge in the art. Therefore, the shape of the elements in the drawing has been exaggerated to emphasize a clearer explanation.

A controller may control an overall operation of a substrate treating apparatus. The controller may include a central processing unit (CPU), a read only memory (ROM), and a random access memory (RAM). The CPU executes a desired treatment such as a liquid treatment and a drying treatment to be described later according to various recipes stored in these storage areas. A recipe may contain a process time, a process pressure, a process temperature, and various gas flow rates, which are a control information of the apparatus regarding process conditions. Meanwhile, these programs or recipes representing process conditions may be stored in a hard disk or a semiconductor memory. In addition, the recipe may be set at a predetermined location in the storage area while being stored in a storage medium such as a CD-ROM or DVD that is readable by a transportable computer.

The apparatus of the embodiment of the inventive concept may be used to perform a photolithography process on a circular substrate. In particular, the apparatus of the embodiment of the inventive concept may be connected to an exposing device and used to perform a coating process and a developing process on a substrate. However, the technical idea of the inventive concept is not limited thereto, and may be used in various kinds of processes for supplying a treating liquid to the substrate while rotating the substrate. Hereinafter, a case in which a wafer is used as the substrate will be described as an example.

Hereinafter, an embodiment of the inventive concept will be described with reference to FIG. 2 to FIG. 12.

Figure 2:
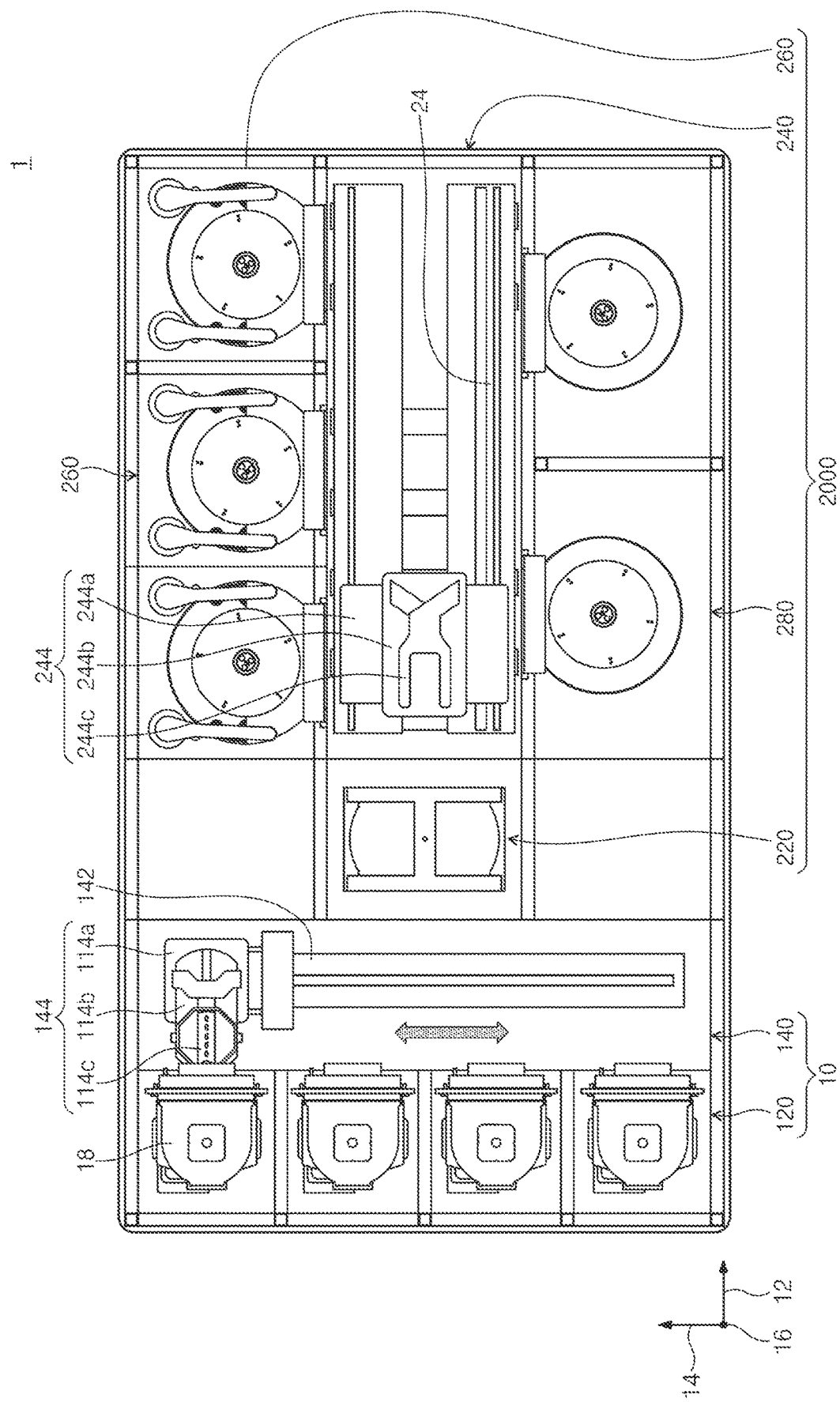
FIG. 2 is a plan view illustrating a substrate treating facility according to an embodiment of the inventive concept.

Referring to FIG. 2, the substrate treating facility 1 has an index module 10 and a process treating module 20, and the index module 10 has a load port 120 and a transfer frame 140. The load port 120, the transfer frame 140, and the process treating module 20 are sequentially arranged in a direction. Hereinafter, the direction in which the load port 120, the transfer frame 140, and the process treating module 20 are arranged is referred to as a first direction 12, a direction perpendicular to the first direction 12 when seen from above is referred to as a second direction 14, and a direction perpendicular to a plane including the first direction 12 and the second direction 14 is referred to as a third direction 16.

A carrier 18 in which a substrate W is stored is mounted on the load port 120. The load port 120 is provided in a plurality, and they are arranged in a direction along the second direction 14. FIG. 2 illustrates that four load ports 120 are provided. However, the number of load ports 120 may increase or decrease according to conditions such as a process efficiency and a foot print of the process treating module 20. A slot (not shown) provided to support an edge of the substrate is formed at the carrier 18. The slot is provided in a plurality along the third direction 16, and the substrate is positioned within the carrier 18 to be stacked while being spaced apart from each other along the third direction 16. A front opening unified pod (FOUP) may be used as the carrier 18.

The process treating module 20 includes a buffer unit 220, a transfer chamber 240, a first process unit 260, and a second process unit 280. The transfer chamber 240 is disposed in a lengthwise direction parallel to the first direction 12. At a side of the transfer chamber 240 first process units 260 are disposed along the second direction 14, and at another side of the transfer chamber 240 second process units 280 are disposed along the second direction 14. The first process units 260 and the second process units 280 may be provided to be symmetrical to each other with respect to the transfer chamber 240. Some of the first process units 260 are disposed along a lengthwise direction of the transfer chamber 240. In addition, some of the first process units 260 are disposed to be stacked on each other. That is, the first process units 260 may be arranged on a side of the transfer chamber 240 in an array of A×B (A and B are each a natural number of 1 or more). Here, A is the number of first process units 260 provided along the first direction 12, and B is the number of second process units 260 provided along the third direction 16. When four or six first process units 260 are provided on a side of the transfer chamber 240, the first process units 260 may be arranged in an array of 2×2 or 3×2. The number of first process units 260 may increase or decrease. Similar to the first process units 260, the second process units 280 may be arranged in an array of M×N (M and N are each a natural number of 1 or more). Here, M and N may respectively be the same number as A and B. Unlike the above description, both the first process unit 260 and the second process unit 280 may be provided only on one side of the transfer chamber 240. In addition, unlike the above description, the first process unit 260 and the second process unit 280 may be provided in a single layer on one side and on the other side of the transfer chamber 240, respectively. In addition, the first process unit 260 and the second process unit 280 may be provided in various arrangements differently from those described above.

The buffer unit 220 is disposed between the transfer frame 140 and the transfer chamber 240. The buffer unit 220 provides a space in which the substrate W remains before the substrate W is transferred between the transfer chamber 240 and the transfer frame 140. The buffer unit 220 is provided with slots (not shown) in which the substrate W is placed, and a plurality of slots (not shown) are provided to be spaced apart from each other along the third direction 16. Each of a surface of the buffer unit 220 facing the transfer frame 140 and a surface facing the transfer chamber 240 is opened.

The transfer frame 140 transfers the substrate W between the carrier 18 seated on the load port 120 and the buffer unit 220. The transfer frame 140 is provided with an index rail 142 and an index robot 144. The index rail 142 is provided in a lengthwise direction parallel to the second direction 14. The index robot 144 is installed on the index rail 142 and is linearly moved in the second direction 14 along the index rail 142. The index robot 144 has a base 144a, a body 144b, and an index arm 144c. The base 144a is installed to be movable along the index rail 142. The body 144b is coupled to the base 144a. The body 144b is provided to be movable along the third direction 16 on the base 144a. In addition, the body 144b is provided to be rotatable on the base 144a. The index arm 144c is coupled to the body 144b and is provided to be forwardly and backwardly movable with respect to the body 144b. The index arm 144c provided in a plurality are provided to be individually driven. The index arms 144c are disposed to be stacked on each other while being spaced apart from each other in the third direction 16. Some of the index arms 144c may be used to transfer the substrate W from the process treating module 20 to the carrier 18, and others may be used to transfer the substrate W from the carrier 18 to the process treating module 20. This may prevent particles generated from the substrate W before a process treating from being attached to the substrate W after the process treating during a process of bringing in and taking out the substrate W by the index robot 144.

The transfer chamber 240 transfers the substrate W between the buffer unit 220, the first process unit 260, and the second process unit 280. The transfer chamber 240 is provided with a guide rail 242 and a main robot 244. The guide rail 242 is disposed with its lengthwise direction parallel to the first direction 12. The main robot 244 is installed on the guide rail 242 and is linearly moved along the first direction 12 on the guide rail 242.

The first process unit 260 and the second process unit 280 may be provided to sequentially perform a process on one substrate W. For example, the substrate W may be subjected to a chemical process, a rinsing process, and a first drying process in the first process unit 260, and a second drying process in the second process unit 260. In this case, the first drying process may be performed by an organic solvent, and the second drying process may be performed by a supercritical fluid. An isopropyl alcohol IPA liquid may be used as the organic solvent, and a carbon dioxide $CO_2$ may be used as the supercritical fluid. Unlike this, the first drying process in the first process unit 260 may be omitted.

Hereinafter, the substrate treating apparatus 300 provided in the first process unit 260 will be described.

Figure 3:
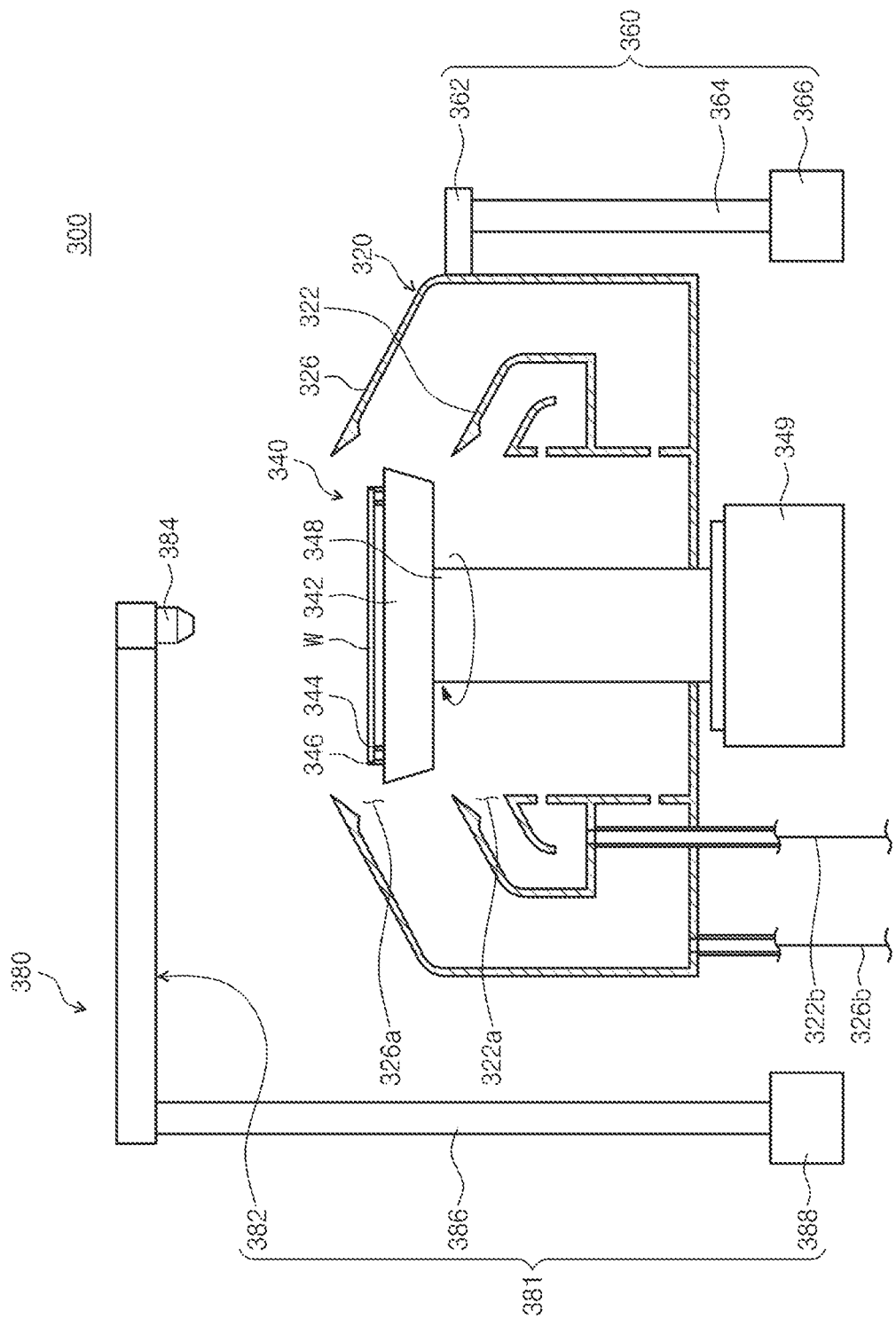
FIG. 3 is a cross-sectional view illustrating an apparatus for clean treating a substrate in a first process unit of FIG. 2.

FIG. 3 is a cross-sectional view illustrating an apparatus for cleaning the substrate in the first process unit of FIG. 2.

Referring to FIG. 3, the substrate treating apparatus 300 includes a treating container 320, a spin head 340, a lifting/lowering unit 360, and an injection member 380. The treating container 320 provides a space in which a treating process of the substrate is performed, and a top portion thereof is opened. The treating container 320 has an inner recollecting container 322 and an outer recollecting container 326. Each of the recollecting containers 322 and 326 recollect different treating liquids among the treating liquids used in the process. The inner recollecting container 322 is provided in an annular ring shape surrounding the spin head 340, and the outer recollecting container 326 is provided in an annular ring shape surrounding the inner recollecting container 322. An inner space 322a of the inner recollecting container 322 and a space 326a between the outer recollecting container 326 and the inner recollecting container 322 function as an inlet through which the treating liquid flows respectively into the inner recollecting container 322 and the outer recollecting container 326. Recollecting lines 322b and 326b extending vertically in a bottom direction of respective bottom surfaces of the recollecting containers 322 and 326 are connected to the recollecting containers 322 and 326. Each of the recollecting lines 322b and 326b discharges a treating liquid introduced through each of the recollecting containers 322 and 326. A discharged treating liquid may be reused through an external treating liquid regeneration system (not shown).

The spin head 340 is disposed within the treating container 320. The spin head 340 supports the substrate W and rotates the substrate W during the process. The spin head 340 has a body 342, a support pin 344, a chuck pin 346, and a support shaft 348. The body 342 has a top surface that is provided in a substantially circular shape when viewed from above. A support shaft 348 rotatable by a motor 349 is fixedly coupled to a bottom surface of the body 342. The support pin 344 is provided in a plurality. The support pins 344 are disposed to be spaced apart by a predetermined distance at an edge of the top surface of the body 342 and upwardly protrude from the body 342. The support pins 344 are disposed to have an annular ring shape as a whole by combination with each other. The support pin 344 supports an edge of a bottom surface of the substrate so that the substrate W is spaced apart from the top surface of the body 342 by a predetermined distance. A plurality of chuck pins 346 are provided. The chuck pin 346 is disposed farther from a center of the body 342 than the support pin 344. The chuck pin 346 is provided to upwardly protrude from the body 342. The chuck pin 346 supports a side portion of the substrate W so that the substrate W is not laterally separated from a correct position when the spin head 340 is rotated. The chuck pin 346 is provided to be linearly movable between a standby position and a support position along a radial direction of the body 342. The standby position is a position farther from the center of the body 342 than the support position. When the substrate W loads or unloads on the spin head 340, the chuck pin 346 is positioned at the standby position, and when performing a process on the substrate W, the chuck pin 346 is positioned at the support position. At the support position, the chuck pin 346 is in contact with the side of the substrate W.

The lifting/lowering unit 360 linearly moves the treating container 320 in an up/down direction. As the treating container 320 is moved up and down, a relative height of the treating container 320 with respect to the spin head 340 is changed. The lifting/lowering unit 360 has a bracket 362, a moving shaft 364, and a driver 366. The bracket 362 is fixedly installed on an outer wall of the treating container 320, and the moving shaft 364 moving in the up/down direction by the driver 366 is fixedly coupled to the bracket 362. When the substrate W is placed on the spin head 340 or lifted from the spin head 340, the treating container 320 is lowered so that the spin head 340 upwardly protrudes from the treating container 320. In addition, when the process proceeds, a height of the treating container 320 is adjusted so that the treating liquid may flow into the predetermined recollecting containers 322 and 326 according to a type of treating liquid supplied to the substrate W.

Unlike the above description, the lifting/lowering unit 360 may move the spin head 340 in the up/down direction instead of the treating container 320.

The injection member 380 supplies the treating liquid onto the substrate W. The injection member 380 has a nozzle support 382, a nozzle 384, a support shaft 386, and a driver 388. The support shaft 386 is provided with its lengthwise direction along the third direction 16, and a driver 388 is coupled to a bottom end of the support shaft 386. The driver 388 rotates and lifts the support shaft 386. The nozzle support 382 is vertically coupled to an opposite end of the support shaft 386 coupled to the driver 388. The nozzle 384 is installed on a bottom surface of an end of the nozzle support 382. The nozzle 384 is moved to a process position and a standby position by the driver 388. The process position is a position where the nozzle 384 is disposed vertically above the substrate W placed on the spin head 340, and the standby position may be defined as a position where the nozzle 384 deviates from a position vertically above the treating container 320. One or more injection members 380 may be provided. When a plurality of injection members 380 are provided, each of a chemical, a rinsing liquid, and an organic solvent may be provided through different injection members 380. The chemical may be a liquid with strong acid or strong base properties. The rinsing liquid can be a deionized water. The organic solvent may be a mixture of an isopropyl alcohol vapor and an inert gas or an isopropyl alcohol liquid.

The second process unit 280 is provided with a substrate treating apparatus 400 for performing a second drying process of the substrate W. The substrate treating apparatus 400 performs a second drying process on a substrate W which has been treated by the first drying process in the first process unit 260. The substrate treating apparatus 400 dry treats the substrate W in which an organic solvent remains. The substrate treating apparatus 400 may dry the substrate W using a supercritical fluid.

Figure 4:
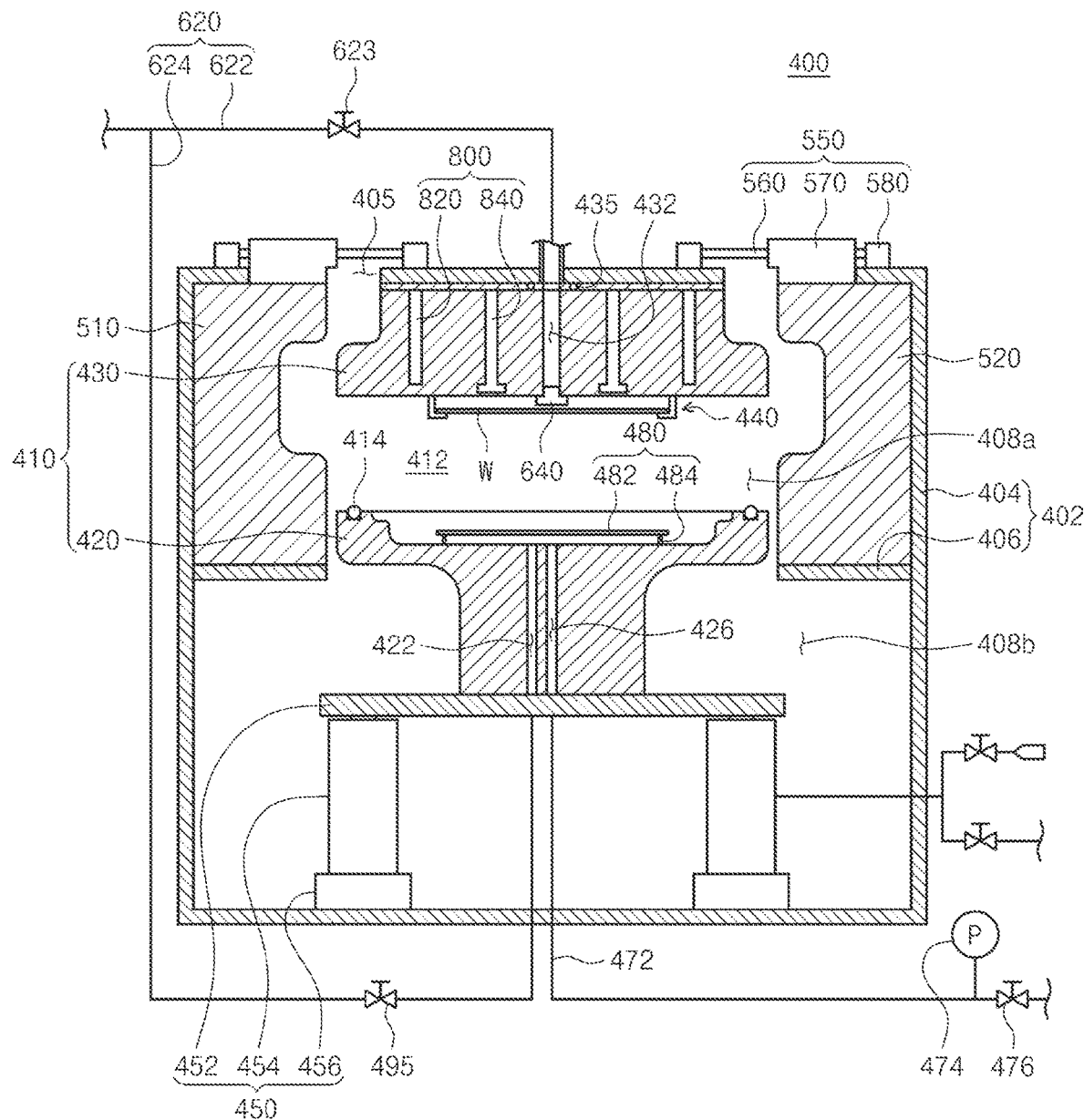
FIG. 4 is a cross-sectional view illustrating an apparatus for dry treating the substrate in a second process unit of FIG. 2.
Figure 5:
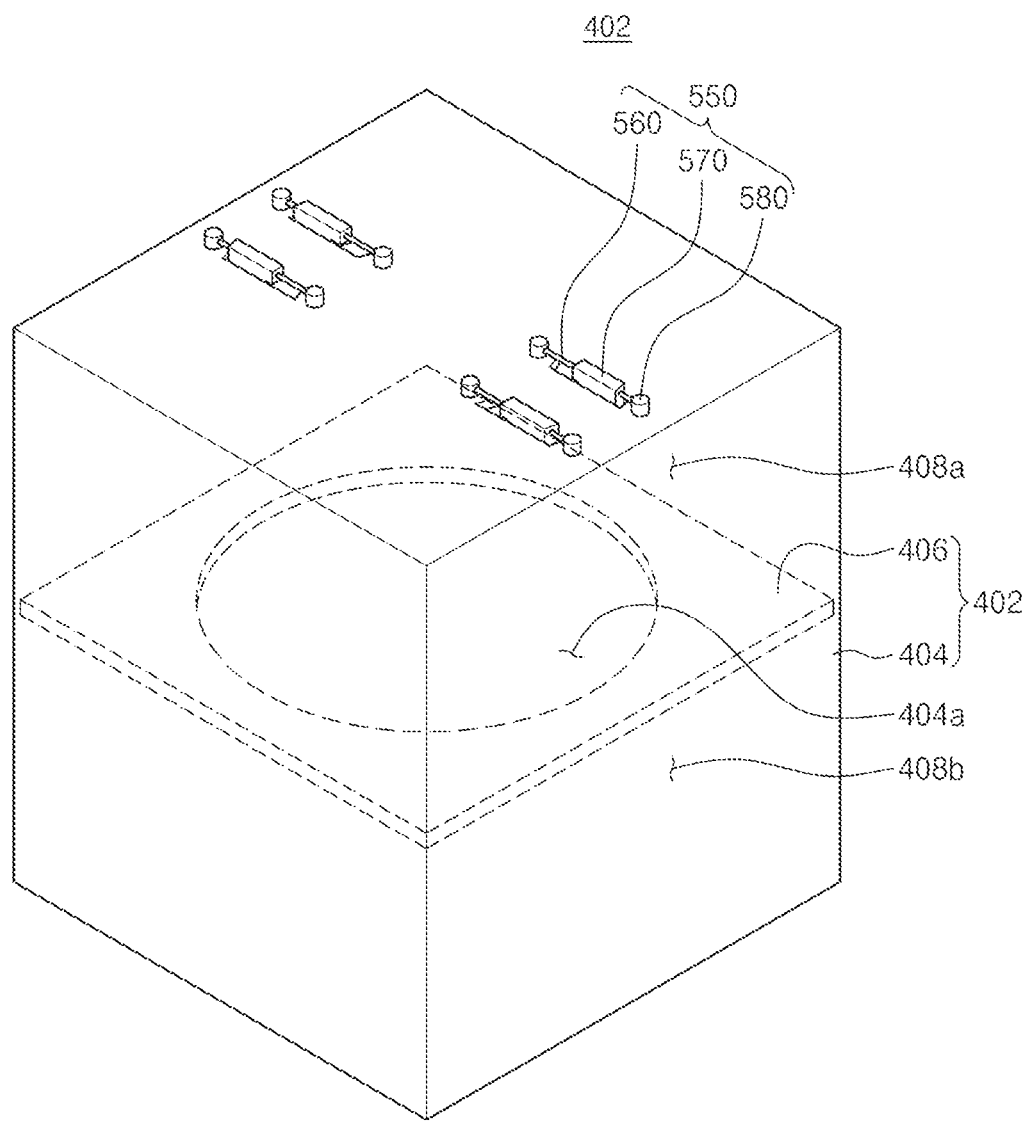
FIG. 5 is a perspective view illustrating a housing of FIG. 4.

FIG. 4 is a cross-sectional view illustrating an apparatus for dry treating the substrate in the second process unit of FIG. 2, and FIG. 5 is a perspective view illustrating a housing of FIG. 4.

Referring to FIG. 4 and FIG. 5, the substrate treating apparatus 400 includes a housing 402, a process chamber 410, a substrate support unit 440, a lifting/lowering member 450, a blocking member 480, an exhaust unit 470, a fluid supply unit 600, a clamping member 500, a moving member 550, and a temperature control unit 800.

The housing 402 includes a main body 404 and an intermediate plate 406. The main body 404 may have a container shape defining a space therein. For example, the main body 404 may have a rectangular parallelepiped shape. At a top surface of the main body 404, slit-shaped through holes 405 are formed. The through holes 405 are provided to have a same lengthwise direction at different locations. According to an embodiment, there are four through holes 405, two of which may be located on one side, and the other two may be located on the other side opposing the one side. In some embodiments, the through holes 405 may be provided in even numbers, and may be two or six or more. The through hole 405 functions as a passage connecting the moving member 550 and the clamping member 500.

The intermediate plate 406 is located within the main body 404. The intermediate plate 406 divides the space defined by the main body 404 into a top space 408a and a bottom space 408b. The intermediate plate 406 has an opening 404a. A second body 420 is provided to be insertable in the opening 404a. The opening 404a in the intermediate plate 406 may have a diameter larger than that of a bottom end of the second body 420. The process chamber 410 and the clamping member 500 may be positioned at the top space 408a, and the lifting/lowering member 450 may be positioned at the bottom space 408b. The moving member 550 may be positioned on an outer wall of the housing 402.

The process chamber 410 has a treating space 412 for treating the substrate W therein. The process chamber 410 seals the treating space 412 from the outside while treating the substrate W. The process chamber 410 includes the second body 420, a first body 430, and a sealing member 414. A bottom surface of the second body 420 facing the treating space 412 has a stepped portion. The top surface of the second body 420 has a recessed portion such that peripheral portion is higher than central portion. The second body 420 may be lifted and lowered to the top space 408a and the bottom space 408b of the main body 404 through the opening 404a of the intermediate plate 406 by the lifting/lowering member 450. A bottom supply port 422 and an exhaust port 426 are formed through the second body 420 from the top surface to a bottom surface thereof. When viewed from above, the bottom supply port 422 may be positioned out of a central axis of the second body 420. The bottom supply port 422 functions as a flow path for supplying a supercritical fluid to the treating space 412.

The first body 430 and the second body 420 in combination define a treating space 412. The first body 430 is provide above the second body 420 and thus may be referred to as a top body 430, and the second body 420 may be referred to as a bottom body 420. The first body 430 is located in the top space 408a of the housing 402. The first body 430 is coupled to a ceiling surface of the main body 404 by a buffer member 435. The buffer member 435 may be formed of an elastic material. The buffer member 435 may be a leaf spring or a coil spring. For example, the buffer member 435 may be a spring. A top surface of the first body 430 has a stepped portion. The top surface of the first body 430 has a recessed portion such that peripheral portion is lower than central portion. A top supply port 432 is formed through the top surface to a bottom surface of the first body 430. The top supply port 432 functions as a fluid channel through which a supercritical fluid is supplied to the treating space 412. The top supply port 432 may be positioned at a center of the first body 430. According to an embodiment, each of the first body 430 and the second body 420 may be made of or include a metal material.

The sealing member 414 seals a gap between the first body 430 and the second body 420. The sealing member 414 is positioned between the first body 430 and the second body 420. The sealing member 414 has an annular ring shape. For example, the sealing member 414 may be provided as an O-ring 414. The sealing member 414 is provided on the bottom surface of the first body 430 or the top surface of the second body 420. As an example, in the FIG. 4, it is illustrated that the sealing member 414 is provided on the top surface (e.g., peripheral portion) of the second body 420. A sealing groove into which the sealing member 414 is inserted is formed on the top surface of the second body 420. Some portions of the sealing member 414 are inserted into the sealing groove, and some other portions protrude from the sealing groove. The sealing member 414 may be made of a material having an elasticity.

Figure 6:
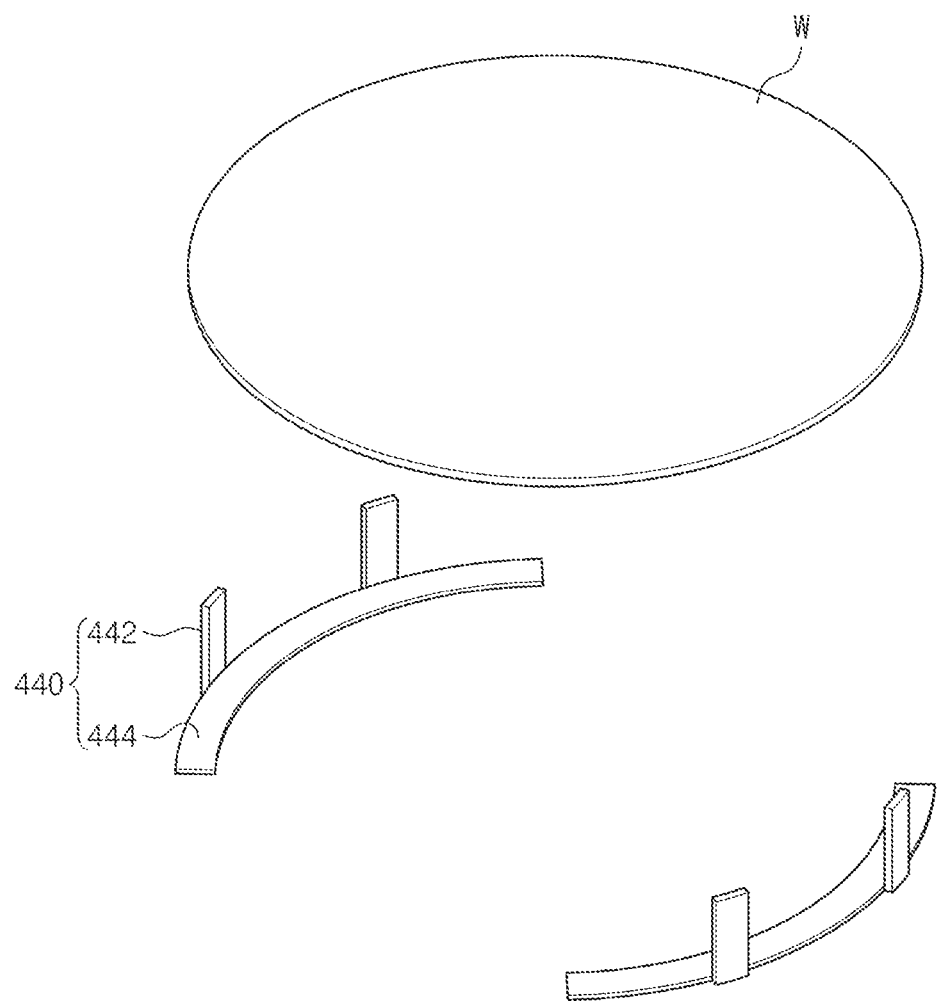
FIG. 6 is a perspective view illustrating a substrate support unit of FIG. 4.

The substrate support unit 440 supports the substrate W in the treating space 412. FIG. 6 is a perspective view illustrating the substrate support unit of FIG. 4. Referring to FIG. 6, the substrate support unit 440 supports the substrate W with a surface to be treated of the substrate W facing upward. The substrate support unit 440 includes a lateral support 442 and a base support 444. The lateral support 442 has a bar shape downwardly extending from the bottom surface of the first body 430. The lateral support 442 is provided in a plurality. For example, there may be four lateral supports 442. The base support 444 supports an edge of a bottom surface of the substrate W. The base support 444 is provided in a plurality. For example, there may be two base supports 444. When viewed from above, each of the base support 444 has an arc shaped strip with a curvature substantially corresponding to those of the substrate W and thus the two base supports 444 spaced apart from each other may define a circle substantially matching with or similar to the substrate W. The lateral supports 442 may be connected to an outer side surface of the arc shaped base support 444, and thus may prevent lateral movement of the substrate W supported on the base support 444.

Referring back to FIG. 4 and FIG. 5, the lifting/lowering member 450 adjusts a relative position between the first body 430 and the second body 420. The lifting/lowering member 450 lifts and lowers one of the first body 430 and the second body 420 so they may be spaced apart from or closely adhered to the other. The lifting/lowering member 450 lifts and lowers one of the first body 430 and the second body 420 so that the process chamber 410 is in an open state or a sealed state (e.g., processing state). Here, the open state is a state where the first body 430 and the second body 420 are spaced apart from each other, and the sealed state is a state where the first body 430 and the second body 420 are in close contact with each other. That is, at the open state the treating space 412 is opened to the outside, and at the sealed state the treating space 412 is sealed from the outside. In the example embodiment, it is described that the lifting/lowering member 450 lifts and lowers the second body 420, and the position of the first body 430 is fixed. In some embodiments, the second body 420 may be fixed, and the first body 430 may be lifted and lowered with respect to the second body 420. In this case, the lifting/lowering member 450 may be located at the top space 408a.

The lifting/lowering member 450 includes a support plate 452, a lifting/lowering shaft 454, and a driver 456. The support plate 452 supports the second body 420 at the bottom space 408b. The second body 420 is fixedly coupled to the support plate 452. The support plate 452 has a circular plate shape. The support plate 452 has a diameter larger than that of the opening 404a of the intermediate plate 406. Accordingly, the bottom end of the second body 420 is located at the bottom space 408b even in the sealed state between the first body 430 and the second body 420. The lifting/lowering shaft 454 supports the bottom surface of the support plate 452 in the bottom space 408b. The lifting/lowering shaft 454 is fixedly coupled to the support plate 452. The lifting/lowering shafts 454 are provided in a plurality. The lifting/lowering shafts 454 may be disposed along a circumferential direction of the support plate 452, e.g., at the peripheral edge of the bottom surface of the support plate 452. The driver 456 lifts and lowers each of the lifting/lowering shafts 454. The driver 456 is provided in a plurality and coupled to the lifting/lowering shaft 454 to correspond one-on-one. When a driving force is provided to the driver 456, the second body 420 and the lifting/lowering shaft 454 are lifted to combine with the first body 430, and the first body 430 and the second body 420 define the treating space 412 sealed, i.e., the sealed state. The driving force may be simultaneously provided to or released from the drivers 456. Accordingly, the plurality of lifting/lowering shafts 454 are positioned at the same height during a lifting and a lowering, and the support plate 452 and the second body 420 may be lifted and lowered while maintaining a horizontal state. For example, the driver 456 may be a cylinder or a motor.

The blocking member 480 prevents the supercritical fluid supplied from the bottom supply port 474 from being directly supplied to a non-treating surface (bottom surface) of the substrate W. The blocking member 480 includes a blocking plate 482 and a support 484. The blocking plate 482 is positioned between the bottom supply port 474 and the substrate support unit 440. The blocking plate 482 has a circular plate shape. The blocking plate 482 has a diameter smaller than a diameter of the second body 420. When viewed from above, the blocking plate 482 has a diameter covering both the bottom supply port 474 and the exhaust port 426. For example, the blocking plate 482 may be provided to have a diameter corresponding to or larger than a diameter of the substrate W. The support 484 supports the blocking plate 482. The supports 484 are provided in a plurality, and are arranged along a circumferential direction of the blocking plate 482. The supports 484 are arranged to be spaced apart from each other at constant intervals.

The exhaust unit 470 exhausts an atmosphere of the treating space 412. The process by-products generated in the treating space 412 are exhausted through the exhaust unit 470. The exhausting may be a natural exhaust or a forced exhaust. In addition, the exhaust unit 470 may simultaneously exhaust process by-products and adjust a pressure of the treating space 412. The exhaust unit 470 includes an exhaust line 472 and a pressure measuring member 474. The exhaust line 472 is connected to the exhaust port 426. An exhaust valve 476 installed at the exhaust line 472 may adjust an amount of exhaust in the treating space 412. The pressure measuring member 474 is installed at the exhaust line 472 and measures a pressure of the exhaust line 472. The pressure measuring member 474 is located upstream of the exhaust valve 476 with respect to the exhaust direction. The treating space 412 may be decompressed by the exhaust unit 470 to an atmospheric pressure or a pressure corresponding to the outside of the process chamber 410.

The clamping member 500 may clamp the first body 430 and the second body 420 positioned at a closed position. Therefore, even if a pressure in the treating space increases during the process, it is possible to prevent a gap from occurring between the first body 430 and the second body 420.

Figure 7:
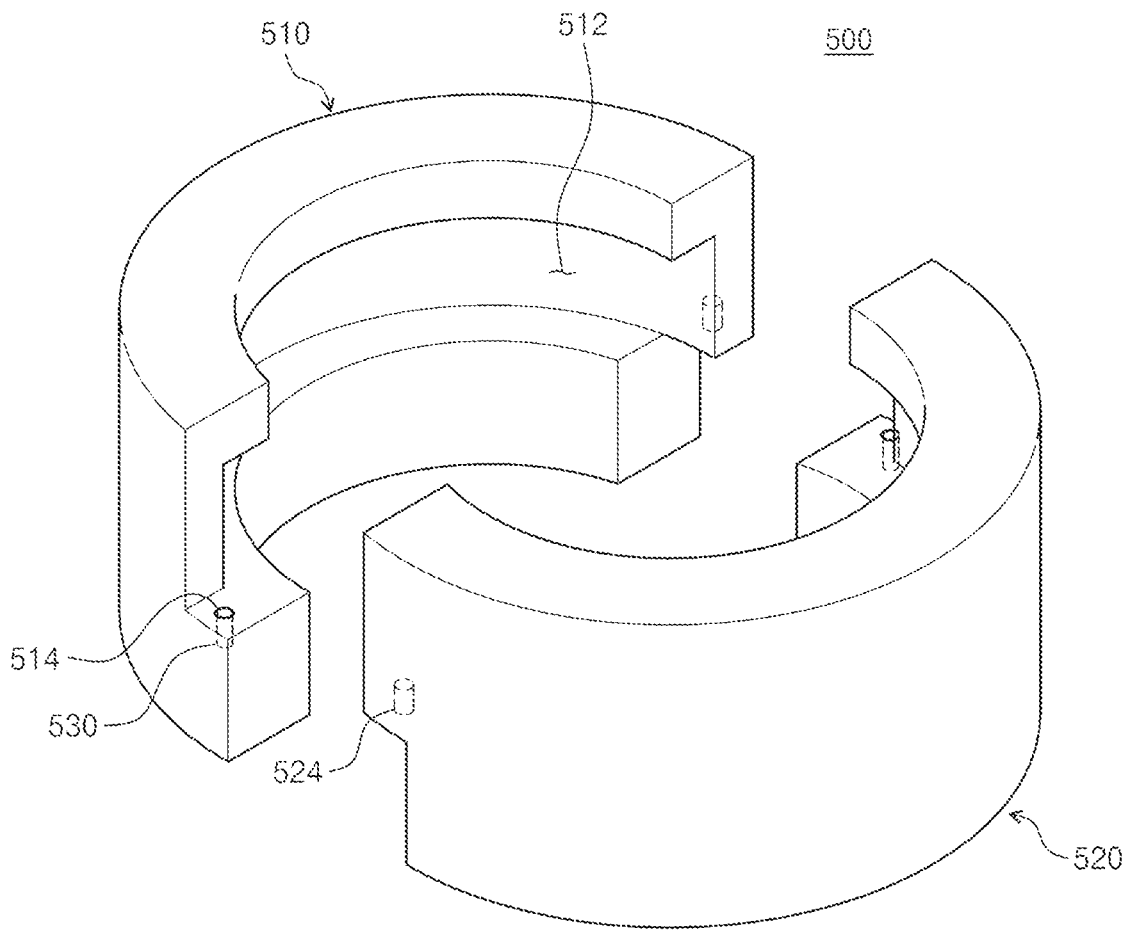
FIG. 7 is a perspective view illustrating a clamping member of FIG. 4.

FIG. 7 is a perspective view illustrating the clamping member of FIG. 4. Referring to FIG. 7, the clamping member 500 includes a first clamp 510, a second clamp 520, and a locking pin 530. The first clamp 510 and the second clamp 520 are located on a side of the process chamber 410. According to an embodiment, the first clamp 510 and the second clamp 520 are positioned to face each other with the process chamber 410 interposed therebetween. The first clamp 510 and the second clamp 520 are arranged to surround the process chamber 410. Each of the first clamp 510 and the second clamp 520 has a clamp groove 512 formed on an inner surface facing the process chamber 410. An edge portion of the bottom portion of first body 430 and an edge portion of the top portion of the second body 420 in the sealed state may be inserted into the clamp groove 512. That is, each of the edge portion of the bottom portion of the first body 430 and the edge portion of the top portion of the second body 420 is clamped by the clamping member 500 via the clamp groove 512.

The clamping member 500 may have a locked state or an unlocked state. Here, the lock state is defined as a state where the first clamp 510 and the second clamp 520 are close to each other to clamp the first body 430 and the second body 420, and the unlocked state is defined as a state where the first body 430 and the second body 420 are released from clamping by the first clamp 510 and the second clamp 520. The first clamp 510 and the second clamp 520 are combined with each other at the locked state to have an annular ring shape. For example, the first clamp 510 and the second clamp 520 may have horizontal cross-sections, for example, "C" shaped configurations, symmetrical to each other.

The first clamp 510 has two side ends, each having stepped portion. For example, one side end of the first clamp 510 has an upper side end portion and lower side end portion with the lower side end portion protruding laterally beyond the upper side end portion, and the other side end of the first clamp 510 has an upper side end portion and lower side end portion with the upper side end portion protruding laterally beyond the lower side end portion. The second clamp 520 has two side ends, each having stepped portion with reversed configuration to those of the first clamp 510 such that two opposing side ends of the first clamp 510 and the second clamp 520 mate with each other in the lock state. The first clamp 510 has a first locking pin 530 in a first pin groove 514 in the lower side end portion of the one side end, and has a pin groove for a second locking pin of the second clamp 520 in the upper side end portion of the other side end. Likewise, the second clamp 520 has a second pin groove 524 for the first locking pin 530 of the first clamp 510 in the upper side end portion of the one side end thereof and has the second locking pin in the lower side end portion of the other side end thereof.

Referring back to FIGS. 4 and 5, the moving member 550 moves the first and second clamping members 510 and 520 to the locking state and the unlocking state. The moving member 550 moves the first and second clamping members 510 and 520 in a direction perpendicular to a moving direction of the process chamber 410. The moving member 550 includes a guide rail 560, a bracket 570, and a driving member 580. The guide rail 560 is located outside the housing 402. The guide rail 560 is located adjacent to the top space 408a in which the first body 430 is located. The guide rail 560 is installed on a top surface of the housing 402. The guide rail 560 has a lengthwise direction perpendicular to the moving direction of the process chamber 410. The guide rail 560 is provided in a plurality, and each has a same lengthwise direction. According to an embodiment, the guide rails 560 are provided in the same number as the through holes 405. The guide rail 560 has a lengthwise direction parallel to the through hole 405. When viewed from above, the guide rail 560 is positioned to overlap the through hole 405. The bracket 570 fixes and couples the guide rail 560 and the clamping member 500 to each other. The brackets 570 are provided in the same number as the guide rails 560. According to an embodiment, the guide rail 560 positioned at one side when viewed from above may be connected to the first clamp 510, and the second clamp 520 may be connected to the guide rail positioned at the other side, opposite the one side. The driving member 580 drives the guide rail 560 so that the first and second clamping members 500 are moved to the locking state or the unlocking state along a lengthwise direction of the guide rail 560.

Hereinafter, the fluid supply unit 600 according to the inventive concept will be described in more detail with reference to the drawings.

Figure 8:
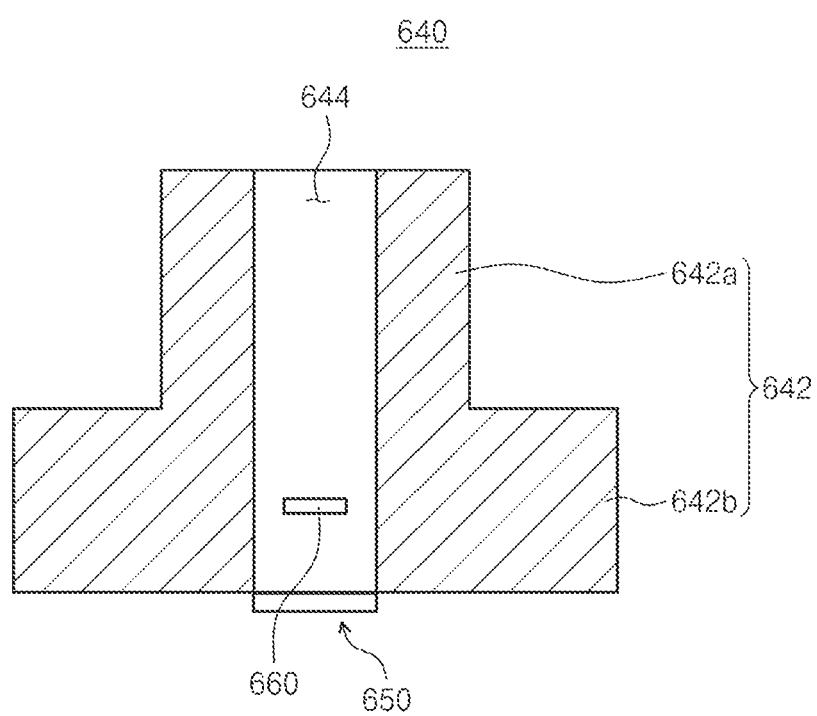
FIG. 8 is a cross-sectional view illustrating an injection unit of FIG. 4.
Figure 9:
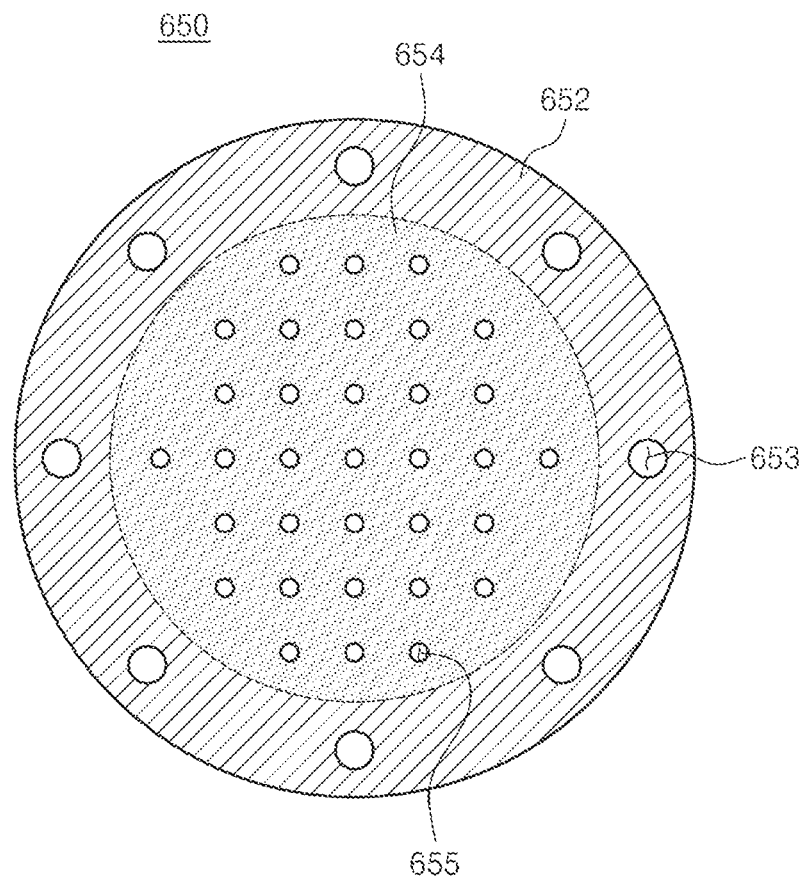
FIG. 9 is a plan view illustrating a nozzle plate of FIG. 8.
Figure 10:
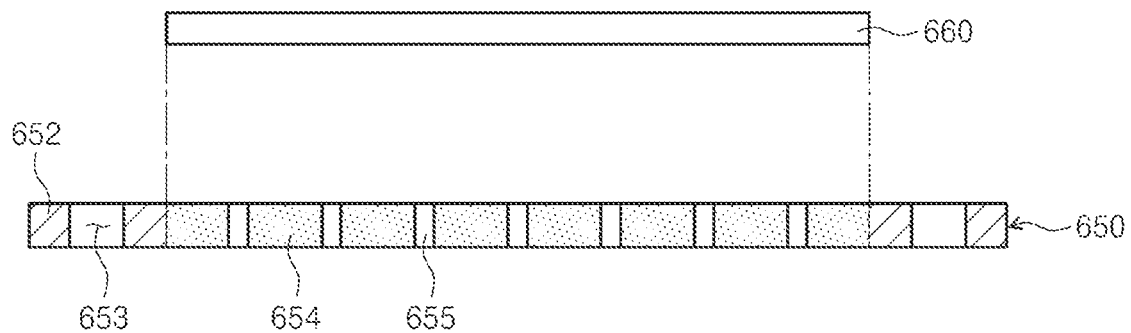
FIG. 10 is a view illustrating the nozzle plate and a blocking plate of FIG. 8.
Figure 11:
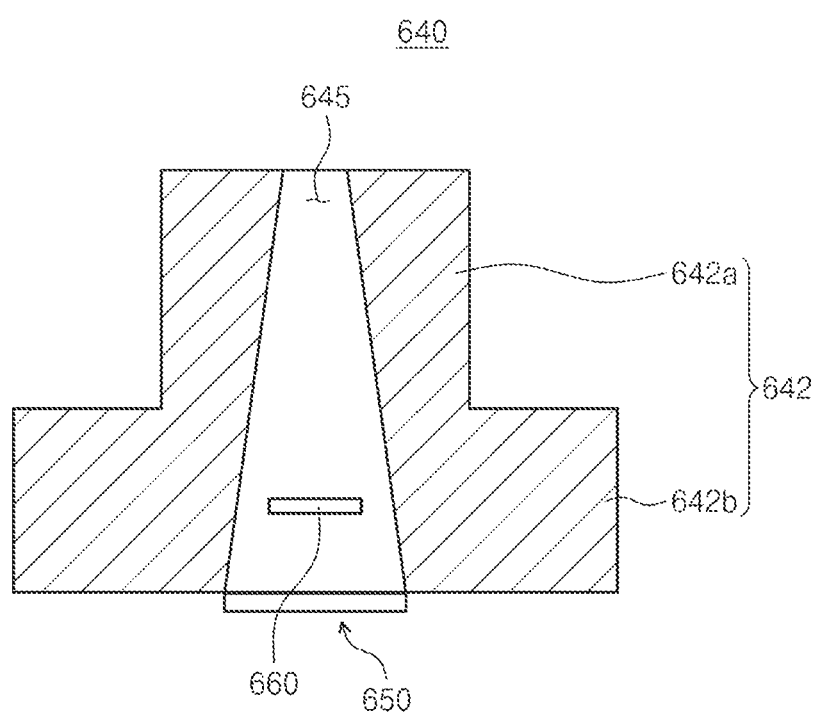
FIG. 11 is a cross-sectional view illustrating the injection unit according to another embodiment of the inventive concept.
Figure 12:
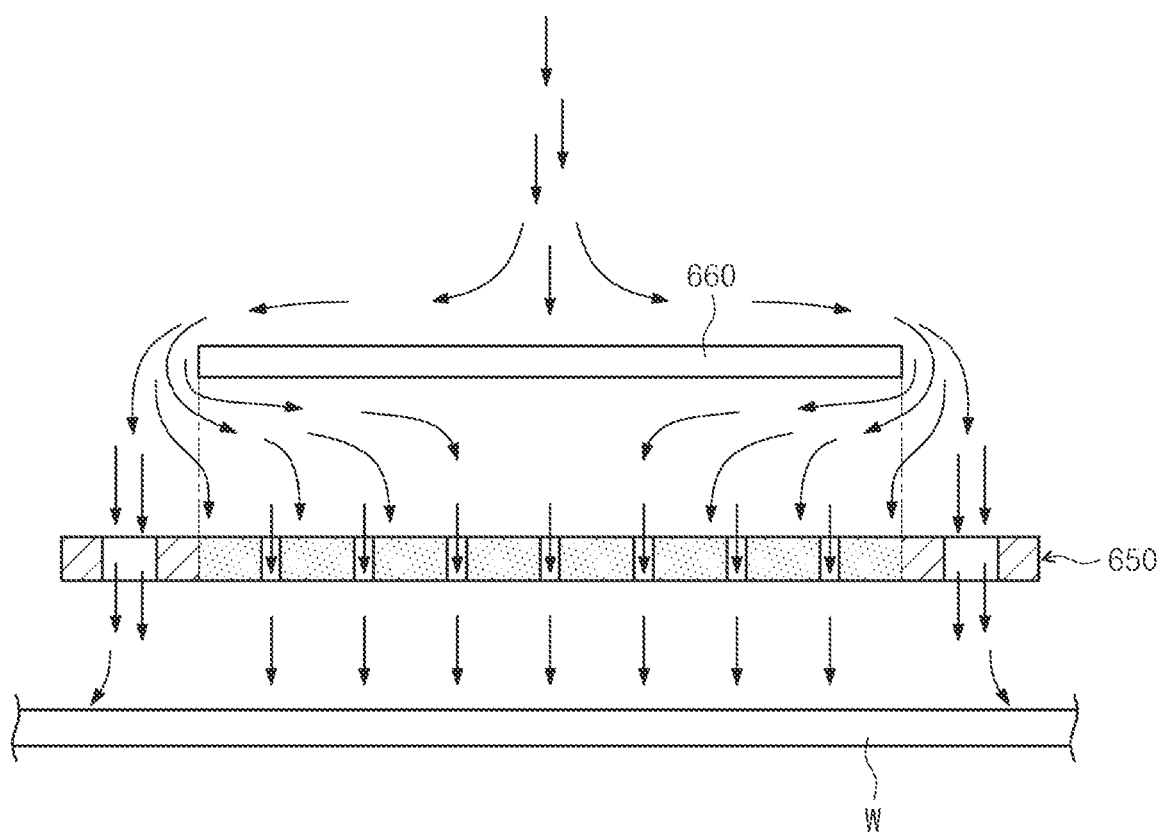
FIG. 12 is a flowchart illustrating a flow of a supercritical fluid according to the inventive concept.

FIG. 8 is a cross-sectional view illustrating the injection unit of FIG. 4, FIG. 9 is a plan view illustrating the nozzle plate of FIG. 8, FIG. 10 illustrates the nozzle plate and the blocking plate of FIG. 8, FIG. 11 is a cross-sectional view illustrating the injection unit of another embodiment of the inventive concept, and FIG. 12 is a flowchart illustrating a flow of a supercritical fluid according to another embodiment of the inventive concept.

Referring back to FIG. 4, the fluid supply unit 600 supplies a treating fluid to the treating space 412. The treating fluid is supplied in a supercritical state by a critical temperature and a critical pressure. The fluid supply unit 600 includes a supply line 620. The supply line 620 includes a top supply line 622 and a bottom supply line 624. The top supply line 622 is connected to the top supply port 432. The treating fluid is sequentially supplied to the treating space 412 through the top supply line 622 and the top supply port 432. A top valve 623 is installed at the top supply line 622. The top valve 623 opens and closes the top supply line 622. The bottom supply line 624 connects the top supply line 622 and the bottom supply port 422 to each other. The bottom supply line 624 is branched from the top supply line 622 and connected to the bottom supply port 422. That is, the treating fluid supplied from each of the top supply line 622 and the bottom supply line 624 may be a same type of fluid. The treating fluid is sequentially supplied to the treating space 412 through the bottom supply line 624 and the bottom supply port 422. A bottom valve 625 is installed at the bottom supply line 624. The bottom valve 625 opens and closes the bottom supply line 624.

According to an embodiment, the treating fluid may be supplied from the bottom supply port 422 facing the non-treated surface of the substrate W, and then the treating fluid may be supplied from the top supply port 432 facing the treated surface of the substrate W. Therefore, the treating fluid may be supplied to the treating space 412 through the bottom supply line 624, and then supplied to the treating space 412 through the top supply line 622. This is to prevent an initially supplied treating fluid which may have a pressure and a temperature below the critical pressure and temperature from being supplied to the substrate W.

Referring back to FIG. 4, the fluid supply unit 600 includes an injection unit 640. The injection unit 640 disperses a fluid supplied through the supply line 620. The injection unit 640 disperses a discharge direction of the fluid. The injection unit 640 is installed at the top supply line 622. A portion of the injection unit 640 is inserted onto the top supply line 622, and the remaining portion thereof is positioned to protrude from the top supply line 622.

Referring to FIG. 8 to FIG. 10, the injection unit 640 has a body 642. The body 642 has a coupling portion 642a and a head portion 642b. The coupling portion 642a is coupled to the top supply line 622. The head portion 642b extends continuously from the coupling portion 642a. The head portion 642a is adjacent the treating space 412 and is wider than the head portion 642a in outer size. According to an embodiment, the coupling portion 642a may be inserted into the top supply line 622 to be screwed. In this case, a thread may be formed at an outer circumferential surface of the coupling portion 642a. The head portion 642b downwardly extends from a bottom end of the coupling portion 642a into the treating space 412. The head portion 642b is positioned between the top body 430 and the substrate W. The head portion 642b may have a cylindrical shape.

Referring to FIG. 8, the body 642 includes a discharge fluid channel 644 formed continuously through the coupling portion 642a and the head portion 642b. The discharge fluid channel 644 serves as a passage through which a fluid flows from the top supply line 622 into the treating space 412. The discharge fluid channel 644 has a constant diameter. The fluid passing through the top supply line 622 passes through the discharge fluid channel 644 of the injection unit 640 and is provided to the substrate W. A nozzle plate 650 to be described later is provided at an end of the discharge fluid channel 644. A diameter of the nozzle plate 650 may be equal to or larger than an inner diameter of the discharge fluid channel 644. A cross-sectional area of the nozzle plate 650 may be equal to or larger than a cross-sectional area of the discharge fluid channel 644. In this case, a fluid flowing through the discharge fluid channel 644 may pass through the nozzle plate 650 to be discharged to the substrate W. A blocking plate 660 is positioned within the discharge fluid channel 644.

The fluid supply unit 600 includes the nozzle plate 650. Referring to FIG. 8, the nozzle plate 650 is provided on a bottom surface of the injection unit 640. The nozzle plate 650 is provided on the bottom surface of the head portion 642b. The nozzle plate 650 is provided on a surface of the head portion 642b facing the substrate W. The nozzle plate 650 is provided at a position blocking the discharge hole of the discharge fluid channel 644 formed on the surface of the head portion 642b facing the substrate W. The nozzle plate 650 is coupled to an end of the discharge fluid channel 644. The nozzle plate 650 may have a cross-sectional area corresponding to or larger than the cross-sectional area of the discharge fluid channel 644. The nozzle plate 650 can have a diameter corresponding to or greater than the diameter of the discharge fluid channel 644. The nozzle plate 650 is disposed to face the substrate W supported by the substrate support unit 440. In this case, the fluid flowing through the discharge fluid channel 644 passes through the nozzle plate 650 and is discharged to the substrate W supported by the substrate support unit 440. A speed of the fluid decreases in a process of passing through the nozzle plate 650, thereby preventing the fluid from being quickly injected onto the substrate W, thereby minimizing a substrate damage.

Referring to FIG. 9, the nozzle plate 650 has a circular plate shape. However, the inventive concept is not limited thereto, and may be formed in a form corresponding to a cross-sectional shape of the discharge fluid channel 644. The nozzle plate 650 includes a first region 652 and a second region 654. The first region 652 includes an edge region of the nozzle plate 650, and the second region 654 includes a central region of the nozzle plate 650. A plurality of holes penetrating the nozzle plate 650 are formed at the nozzle plate 650. The fluid passes through the plurality of holes. The nozzle plate 650 may have a shower head shape. The plurality of holes include a first hole 653 formed at the first region 652 and a second hole 655 formed at the second region 654. The first hole 653 includes a plurality of first holes 653. The plurality of first holes 653 are disposed to be spaced apart from each other along a circumferential direction of the nozzle plate 650. The second hole 655 includes a plurality of second holes 655. The plurality of second holes 655 are disposed to be spaced apart from each other within the second region 654. For example, the distance between adjacent first holes 653 is greater than the distance between adjacent second hole 655.

The first hole 653 and the second hole 655 may have a circular cross section. The first hole 653 is formed larger than the second hole 655. In an embodiment, a diameter of the first hole 653 may be larger than a diameter of the second hole 655. In an embodiment, a cross-sectional area of the first hole 653 is formed to be larger than a cross-sectional area of the second hole 655. The plurality of second holes 655 may be provided in a number higher than the plurality of first holes 653. The supercritical treating process for removing the residual organic solvent supplies a supercritical fluid to the substrate W supported by the substrate support unit 440 to treat the substrate W, and the supercritical treating process is performed in an atmosphere under a critical pressure and a critical temperature. In this case, in a conventional supercritical treating apparatus, the supercritical fluid is supplied to a center of the substrate W, is then dispersed to an edge region of the substrate W, and the organic solvent remaining on the substrate W is dry treated. Here, damage to the substrate W may occur in a process of supplying the supercritical fluid in a high temperature and a high pressure state to the center of the substrate at a high speed. However, in accordance with the inventive concept, a speed and a pressure of a fluid discharged to the center of the substrate W may be reduced by forming the plurality of second holes 655 in the central region (second region 654) of the nozzle plate 650 with a smaller diameter than the first hole 653 in the edge region (first region 652) of the nozzle plate 650.

Referring back to FIG. 8, the fluid supply unit 600 may include the blocking plate 660. The blocking plate 660 is provided within the discharge fluid channel 44. The blocking plate 660 may be provided within a portion of the discharge fluid channel 644 defined by the head portion 642b. The blocking plate 660 is disposed to be spaced apart from the nozzle plate 650. Referring to FIG. 10, the blocking plate 660 is aligned with the second region 652 of the nozzle plate 650, e.g., substantially blocks the plurality of the second holes 655. The blocking plate 660 may have a shape corresponding to the shape of the second region 652 of the nozzle plate 650. The blocking plate 660 may have a diameter corresponding to a diameter of the second region 652 of the nozzle plate 650. The blocking plate 660 is to prevent the fluid flowing through the discharge fluid channel 644 from directly contacting the substrate W through a plurality of holes of the nozzle plate 650. That is, referring to FIG. 12, the fluid in the discharge fluid channel 644 may collide with the blocking plate 660 before reaching the nozzle plate 650, which reduce and/or prevent damage to the substrate. In addition, the blocking plate 660 may change a path of the fluid flowing toward the substrate W. That is, by installing the blocking plate 660 above the nozzle plate 650, e.g., on the upstream of the nozzle plate 650, the traveling distance may have increase and/or the fluid may have a horizontal flowing path in addition to the downward flowing path. Without the blocking plate 660, the fluid may have only downward flowing path. Namely, the blocking plate 660 allows the fluid to flow laterally to edge along the top surface thereof and then flow to the first holes 653 and the second hole 655

Hereinafter, the injection unit 640 according to another embodiment of the inventive concept will be described in more detail with reference to the drawings.

FIG. 11 is a cross-sectional view illustrating the injection unit according to another embodiment of the inventive concept.

The injection unit 640 according to another embodiment of the inventive concept may be configured in the same manner as an embodiment of the inventive concept shown in FIG. 8 except the discharge fluid channel 645. Therefore, hereinafter, the same reference numerals are assigned to the same configuration, redundant descriptions are omitted, and the differences will be mainly described.

Referring to FIG. 11, the discharge fluid channel 645 is formed through the injection unit 640, i.e., through the body 642 from the top surface to the bottom surface. The discharge fluid channel 645 has a varying diameter. The discharge fluid channel 645 has a diameter gradually increasing toward the nozzle plate 650 The discharge fluid channel 645 may have a cross-sectional area increasing toward the bottom surface of the injection unit 640 from the top surface of the injection unit 640. In this case, the fluid flowing through the discharge fluid channel 645 may decrease in speed from the top portion to the bottom portion of the injection unit 640. Accordingly, the fluid primarily reduces in speed while flowing through the discharge fluid channel 645, secondarily decreases in speed when colliding with the blocking plate 660, and tertiarily decreases in speed when passing through the hole of the nozzle plate 640, thereby preventing damage to the substrate W. The nozzle plate 650 is formed in a size and a form corresponding to the discharge hole of the discharge fluid channel 645 formed at the bottom surface of the injection unit 640, or has a diameter larger than the discharge hole of the discharge fluid channel 645 formed at the bottom surface of the injection unit 640.

FIG. 12 is a flowchart illustrating a flow of a supercritical fluid according to the inventive concept.

Referring to FIG. 12, the fluid flowing through the discharge fluid channels 644 and 645 collides with the blocking plate 660 and moves to edges along the top surface of the blocking plate 660. Then, the fluid flowing along the blocking plate 660 flows into a separating space between the blocking plate 660 and the nozzle plate 650. The fluid introduced into the separating space passes through the first hole 653 and the second hole 655 of the nozzle plate 650 and is discharged to the substrate W.

The fluid may be dispersed by the blocking plate 660 to prevent direct damage to the substrate W. In addition, by configuring different sizes of the first hole 653 formed at an edge region 652 of the nozzle plate 650 and the second hole 655 formed in a central region 654 of the nozzle plate 650, it is possible to prevent the fluid from being rapidly injected into the center of the substrate W.

In addition, in the case of the injection unit 640 according to another embodiment, the speed of the fluid may be primarily reduced while the fluid moves through the discharge fluid channel 645, thereby further preventing damage to the substrate W.

The effects of the inventive concept are not limited to the above-mentioned effects, and the unmentioned effects can be clearly understood by those skilled in the art to which the inventive concept pertains from the specification and the accompanying drawings.

Although the preferred embodiment of the inventive concept has been illustrated and described until now, the inventive concept is not limited to the above-described specific embodiment, and it is noted that an ordinary person in the art, to which the inventive concept pertains, may be variously carry out the inventive concept without departing from the essence of the inventive concept claimed in the claims and the modifications should not be construed separately from the technical spirit or prospect of the inventive concept.

What is claimed is:

1. A substrate treating apparatus comprising:
a chamber having a treating space therein;
a substrate support unit configured to support a substrate in the treating space; and
a fluid supply unit configured to supply a fluid in a supercritical state to the treating space,
wherein the fluid supply unit comprises:
a supply line provided at a top wall of the chamber; and
a discharge unit installed at the top wall of the chamber and configured to discharge a fluid to a substrate, and
wherein the discharge unit comprises:
a body having a discharge fluid channel for the fluid;
a nozzle plate provided at a discharge end of the body; and
a blocking plate within the discharge fluid channel and spaced apart from the nozzle plate.

2. The substrate treating apparatus of claim 1, wherein the nozzle plate has a plurality of first holes in a first region thereof, and a plurality of second holes in a second region thereof, the first region including peripheral region of the nozzle plate and the second region including a central region of the nozzle plate,
wherein a cross-section area of the first hole is larger than a cross-sectional area of the second hole.

3. The substrate treating apparatus of claim 2, wherein the blocking plate is disposed such that the plurality of the second holes are located under the blocking plate.

4. The substrate treating apparatus of claim 2, wherein a diameter of the blocking plate is substantially equal to a diameter of the second region of the nozzle plate.

5. The substrate treating apparatus of claim 4, wherein the blocking plate is substantially aligned with the second region of the nozzle plate.

6. The substrate treating apparatus of claim 2, wherein a number of the plurality of the first holes is smaller than a number of the plurality of the second holes.

7. The substrate treating apparatus of claim 1, wherein the discharge fluid channel is formed through the body from a top surface to a bottom surface thereof, and
a diameter of the discharge fluid channel is constant.

8. The substrate treating apparatus of claim 1, wherein the discharge fluid channel is formed through the body from a top surface to a bottom surface thereof, and
a diameter of the discharge fluid channel gradually increases from the top surface of the body to the bottom surface of the body.

9. The substrate treating apparatus of claim 1, wherein the fluid includes a supercritical fluid.

10. A substrate treating apparatus comprising:
a chamber having a treating space therein;
a substrate support unit configured to support a substrate in the treating space; and
a fluid supply unit configured to supply a fluid in a supercritical state to the treating space,
wherein the fluid supply unit comprises:
a supply line provided at a top wall of the chamber; and
a discharge unit installed at the top wall of the chamber and configured to discharge a fluid to a substrate, and
wherein the discharge unit comprises:
a body having a discharge fluid channel for the fluid; and
a nozzle plate provided at a discharge end of the body; and
wherein the nozzle plate comprises:
a first region having a plurality of first holes, the first region including a peripheral region of the nozzle plate; and
a second region having a plurality of second holes, the second region including a central region of the nozzle plate, and
wherein a diameter of each of the plurality of first holes is larger than a diameter of each of the plurality of second holes.

11. A substrate treating apparatus of claim 10, wherein the discharge unit comprises a blocking plate within the discharge fluid channel and spaced apart from the nozzle plate.

12. The substrate treating apparatus of claim 11, wherein the blocking plate has a size substantially corresponding to a size of the second region of the nozzle plate.

13. The substrate treating apparatus of claim 11, wherein the blocking plate is substantially aligned with the second region of the nozzle plate.

14. The substrate treating apparatus of claim 10, wherein the number of the plurality of first holes is smaller than the number of the plurality of second holes.

15. The substrate treating apparatus of claim 10, wherein the plurality of first holes are spaced apart from each other along a circumferential direction of the nozzle plate such that the plurality of first holes surround the plurality of second holes.

16. The substrate treating apparatus of claim 10, wherein the discharge fluid channel is formed through the body from a top and surface to a bottom surface, and
a diameter of the discharge fluid channel is constant from the top surface to the bottom surface.

17. The substrate treating apparatus of claim 10,
the discharge fluid channel is formed through the body from a top surface to a bottom surface, and
a inner diameter of the discharge fluid channel gradually increases from the top surface to the bottom surface.

18. The substrate treating apparatus of claim 17, wherein the nozzle plate has a size corresponding to a size of a discharge port of the discharge fluid channel formed at the bottom surface of the body.

19. The substrate treating apparatus of claim 10, wherein the fluid includes a supercritical fluid.

20. A substrate treating apparatus comprising:
a chamber having a treating space therein;
a substrate support unit configured to support a substrate in the treating space; and
a fluid supply unit configured to supply a fluid in a supercritical state to the treating space,
wherein the fluid supply unit comprises:
a supply line provided at a top wall of the chamber; and
a discharge unit installed at the top wall of the chamber and configured to discharge a fluid to the substrate, and
wherein the discharge unit comprises:
a discharge fluid channel for the fluid;
a nozzle plate provided at an end of the discharge fluid channel; and
a blocking plate within the discharge fluid channel and spaced apart from the nozzle plate, and
wherein the nozzle plate comprises:
a first region having a plurality of first holes with a first diameter formed therein, the first region including a peripheral region of the nozzle plate; and
a second region having a plurality of second holes with a second diameter smaller than the first diameter, the second region including a central region of the nozzle plate, and
wherein the blocking plate has a size corresponding to a size of the second region of the nozzle plate, and
the blocking plate is substantially aligned with the second region of the nozzle plate.

* * * * *